US006687278B1

(12) United States Patent
Mason et al.

(10) Patent No.: US 6,687,278 B1
(45) Date of Patent: Feb. 3, 2004

(54) METHOD OF GENERATING AN OPTICAL SIGNAL WITH A TUNABLE LASER SOURCE WITH INTEGRATED OPTICAL AMPLIFIER

(75) Inventors: Thomas Beck Mason, Middletown, NJ (US); Gregory Fish, Santa Barbara, CA (US); Larry Coldren, Santa Barbara, CA (US)

(73) Assignee: Agility Communications, Inc., Goleta, CA (US)

( * ) Notice: Subject to any disclaimer, the term of this patent is extended or adjusted under 35 U.S.C. 154(b) by 211 days.

(21) Appl. No.: 09/614,665

(22) Filed: Jul. 12, 2000

Related U.S. Application Data

(63) Continuation-in-part of application No. 09/614,377, filed on Jul. 12, 2000, now Pat. No. 6,580,739, and a continuation-in-part of application No. 09/614,895, filed on Jul. 12, 2000, now Pat. No. 6,349,106, and a continuation-in-part of application No. 09/614,378, filed on Jul. 12, 2000, and a continuation-in-part of application No. 09/614,376, filed on Jul. 12, 2000, now Pat. No. 6,614,819, and a continuation-in-part of application No. 09/614,674, filed on Jul. 12, 2000, and a continuation-in-part of application No. 09/614,195, filed on Jul. 12, 2000, now Pat. No. 6,574,259, and a continuation-in-part of application No. 09/614,375, filed on Jul. 12, 2000, and a continuation-in-part of application No. 09/614,224, filed on Jul. 12, 2000.

(60) Provisional application No. 60/152,072, filed on Sep. 2, 1999, provisional application No. 60/152,049, filed on Sep. 2, 1999, and provisional application No. 60/152,038, filed on Sep. 2, 1999.

(51) Int. Cl.[7] ............................................. H01S 5/026

(52) U.S. Cl. .............................. 372/50; 372/20; 438/22

(58) Field of Search ........................ 372/50, 20; 438/22

(56) References Cited

U.S. PATENT DOCUMENTS

| | | | | |
|---|---|---|---|---|
| 4,773,074 A | * | 9/1988 | Hunsperger et al. .......... 372/50 |
| 4,802,182 A | * | 1/1989 | Thornton et al. ............. 372/50 |
| 4,896,325 A | * | 1/1990 | Coldren ....................... 372/20 |
| 5,003,550 A | * | 3/1991 | Welch et al. ................. 372/50 |
| 5,084,894 A | * | 1/1992 | Yamamoto .................... 372/50 |
| 5,088,105 A | | 2/1992 | Scifres et al. ................ 372/92 |
| 5,379,318 A | * | 1/1995 | Weber .......................... 372/96 |
| 5,396,511 A | * | 3/1995 | Nakatsuka et al. ........... 372/43 |
| 5,479,539 A | | 12/1995 | Goldsmith et al. ........... 385/14 |
| 5,525,541 A | | 6/1996 | Krauz et al. ................. 437/161 |
| 5,539,571 A | * | 7/1996 | Welch et al. ................. 359/344 |
| 5,625,636 A | | 4/1997 | Bryan et al. ................. 372/50 |
| 5,674,778 A | | 10/1997 | Lee et al. .................... 437/126 |
| 5,715,268 A | | 2/1998 | Lang et al. ................... 372/50 |
| 5,742,045 A | | 4/1998 | Parker et al. ................ 250/214 |
| 5,838,714 A | * | 11/1998 | Delorme ....................... 372/96 |
| 5,914,480 A | * | 6/1999 | Swartz .................... 235/472.01 |
| 5,936,994 A | * | 8/1999 | Hong et al. ................... 372/96 |

FOREIGN PATENT DOCUMENTS

| | | | |
|---|---|---|---|
| EP | 1 539 028 | 1/1979 | ............. H01S/3/02 |
| EP | 0 620 475 A1 | 3/1994 | ........... G02F/1/313 |

OTHER PUBLICATIONS

Bar–Chaim, N. et al., "Monolithic Optoelectronic Integration of a GaAIAs Laser, a Field–Effect Transistor, and a Photodiode", *Applied Physics Letters*, US, American Institute of Physics, May 15, 1984, vol. 44, No. 10, pp. 941–943.

(List continued on next page.)

*Primary Examiner*—Quyen Leung
*Assistant Examiner*—Jeffrey Zahn
(74) *Attorney, Agent, or Firm*—Gates & Cooper LLP

(57) ABSTRACT

A method of generating an optical signal provides a diode laser assembly including an epitaxial structure formed on a substrate. A laser and an amplifier are formed in the epitaxial structure. At least a portion of the laser and amplifier share a common waveguide. A tunable laser output is produced from the laser. The laser output is coupled into the amplifier along the common waveguide. An optical signal is generated from the amplifier.

26 Claims, 7 Drawing Sheets

OTHER PUBLICATIONS

Koch, T.L., "Semiconductor Photonic Integrated Cicruits", *IEEE Journal of Quantum Electronics*, Mar. 27, 1991, No. 3, pp. 641–653.

Byoung–Sung, K. et al., "Dynamic Analysis of Widely Tunable Laser Diodes Integrated with Sampled–and–Chirped–Grating Distributed Bragg Reflectors and an Electroabsorption Modulator", *IEICE Trans Electron*, Aug. 1998, vol. E81–C, No. 8, pp. 1342–1349.

San–Liang, L. et al., "Sampled Grating DBR Laser Arrays with Adjustable 0.8/1.6–nm Wavelength Spacing", *IEEE Photonics Technology Letters*, Aug. 1999, vol. 11, No. 8, pp. 955–957.

Jayaraman, V. et al., "Theory, Design, and Performance of Extended Tuning Range Semiconductor Lasers with Sampled Gratings", *IEEE Journal of Quantum Electronics*, Jun. 29, 1993, vol. 29, No. 6, pp. 1824–1834.

\* cited by examiner

METHOD OF GENERATING AN OPTICAL SIGNAL WITH A TUNABLE LASER SOURCE WITH INTEGRATED OPTICAL AMPLIFIER

CROSS-REFERENCE TO RELATED APPLICATION

This application is a continuation-in-part and claims the benefit of priority of U.S. Provisional Application Ser. No. 60/152,072, filed Sep. 2, 1999, U.S. Provisional Application Ser. No. 60/152,049, filed Sep. 2, 1999, U.S. Provisional Application Ser. No. 60/152,038, filed Sep. 2, 1999, which applications are fully incorporated by reference herein. This application is also a continuation-in-part of U.S. Ser. Nos. 09/614/377 now U.S. Pat. No. 6,580,739, 09/614,895(now U.S. Pat. No. 6,349,106, issued Feb. 19, 2002), Ser. Nos. 09/614,674, 09/614,378, 09/614,376 now U.S. Pat. No. 6,614,819, 09/614,195now U.S. Pat. No. 6,574,259, 09/614, 375and 09/614,224, filed on the same date as this application, which applications are fully incorporated by reference herein.

FIELD OF THE INVENTION

This invention relates generally to laser assemblies, and more particularly to a widely tunable laser assembly with an integrated optical amplifier.

BRIEF DESCRIPTION OF THE RELATED ART

Thin fibers of optical materials transmit light across a very broad frequency bandwidth and therefore communications data from a light source may be transmitted over such fibers over broad frequency ranges. At any particular frequency, a laser source must have high output power, narrow laser linewidth and good transmission performance through great distances of optical fiber.

In higher bandwidth communications systems, where many frequencies of laser light are transmitted along a fiber, there may be one or several laser sources. While a tunable laser source would be preferred, higher data capacity systems presently use multiple laser sources operating on different frequency channels to cover the wide fiber transmission bandwidth. This is the case since appropriate laser sources are presently incapable of rapid, electronic frequency tuning without attendant deterioration of other significant figures-of-merit.

For example, at a fixed frequency, sampled grating distributed Bragg reflector (SGDBR) lasers have the high output power, narrow laser linewidth and good transmission performance necessary for an optical data network. While some SGDBR lasers can be rapidly tuned over more than 100 different transmission channels, two problems nevertheless prevent these devices from being employed in fiber optic communication systems. The most significant problem is the significant absorption of the mirror material. The resulting large cavity losses act to make the laser output power insufficient for the requirements of a present-day communications system. A second problem is that the output power and frequency tuning are dependent on each other. This coupling results in inadequate controllability for a present-day communications system.

What is needed, instead, is a device with a combination of sufficiently high output power for a high-bandwidth optical communications network and with frequency tuning controllability substantially independent of output power controllability.

SUMMARY

Accordingly, an object of the present invention is to provide an integrated laser assembly that includes a tunable solid state laser and optical amplifier where all of the elements are fabricated in a common epitaxial layer structure.

Another object of the present invention is to provide an integrated laser assembly that includes a tunable solid state laser and optical amplifier with an output mode conditioned for transmission in an optical fiber.

Another object of the present invention is to provide an integrated laser assembly that includes a tunable laser and optical amplifier reducing optical feedback from the amplifier to the laser.

A further object of the present invention is to provide a tunable, integrated laser assembly where laser frequency control and output power control are substantially independent.

These and other objects of the present invention are achieved in a laser assembly that includes an epitaxial structure formed on a substrate. A tunable laser resonator and a separately controllable optical amplifier are formed in the common epitaxial structure. The amplifier is positioned outside of the laser resonator cavity to receive and adjust an output received from the laser, however, at least a portion of the laser and amplifier share a common waveguide.

In different embodiments of the present invention, properties of the common waveguide such as optical properties, or centerline curvature or cross-sectional are non-uniform along the waveguide centerline or non-uniform across a normal to the centerline.

DETAILED DESCRIPTION

Figure 1A:
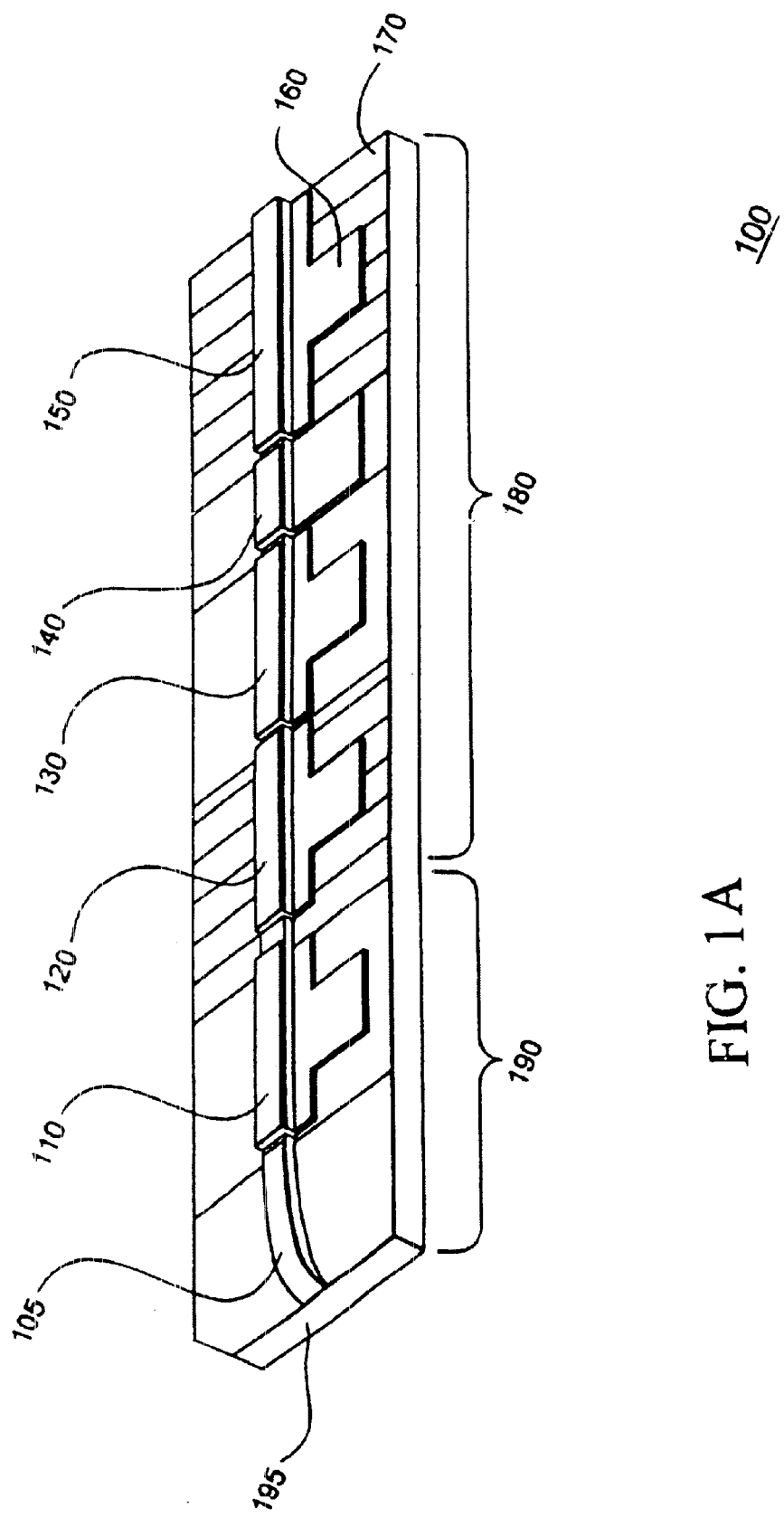
FIG. 1A is a block diagram of a laser assembly that illustrates different functional elements of a laser assembly.

FIG. 1A shows a schematic of an embodiment of the invention. In FIG. 1A, laser assembly 100, waveguide 105, amplifier gain section 110, front resonator mirror 120, laser gain section 130, laser phase control section 140, back mirror 150 and electrical contact 160, epitaxial structure 170, laser 180, optical amplifier 190 and output facet 195 are shown.

In FIG. 1A, laser assembly 100 comprises an integration of a laser and an optical amplifier, with the optical amplifier located external to the laser cavity. Front resonator mirror 120, laser gain section 130, laser phase control section 140, and back mirror 150 form a SGDBR-type laser 180 in epitaxial structure 170. The front and back mirrors define a laser cavity. Amplifier gain section 110 and a portion of waveguide 105 define optical amplifier 190.

As shown in FIG. 1A, despite being external to the laser cavity, the optical amplifier shares a common epitaxial structure 170 with the laser. Epitaxial structure 170 is formed on a substrate (not shown) by processes well-known in the art of semiconductor fabrication. By tailoring optical properties (such as band gap) of different portions of the epitaxial structure, both optically active and optically passive sections can be fabricated in a common structure. Examples of optically active sections of the embodiment shown in FIG. 1 are gain sections 110 and 130, phase control section 140 and mirrors 120 and 150. An example of an optically passive section is the portion of waveguide 105 proximal to output facet 195.

According to the invention, at least a portion of laser 180 and optical amplifier 190 share a common waveguide 105. Different portions of the common waveguide may extend through optically active or passive regions. A common waveguide for the laser and optical amplifier enables the output from the laser to be directly coupled into the amplifier.

In the embodiment of FIG. 1A, amplifier 190 is external to the resonant cavity of laser 180 formed by mirrors 120 and 150. Moreover, amplifier gain section 110 is separately controllable from the laser and is adjustable to increase or decrease the light intensity and output power. The SGBDR laser elements may be controlled separately from the amplifier to tune the laser frequency and otherwise control the input to the optical amplifier. By this arrangement of elements, power amplification and tuning functions are substantially uncoupled.

In the embodiment of FIG. 1A, optical amplifier 190 has an active section and a passive section. The active section, amplifier gain section 110, is substantially straight. The passive section of waveguide 105 is curved and intersects output facet 195 at an oblique angle. Both waveguide curvature and the oblique intersection with the output facet act to prevent reflections at the output facet from coupling back into the optical amplifier 190 and laser 180.

Figure 1B:
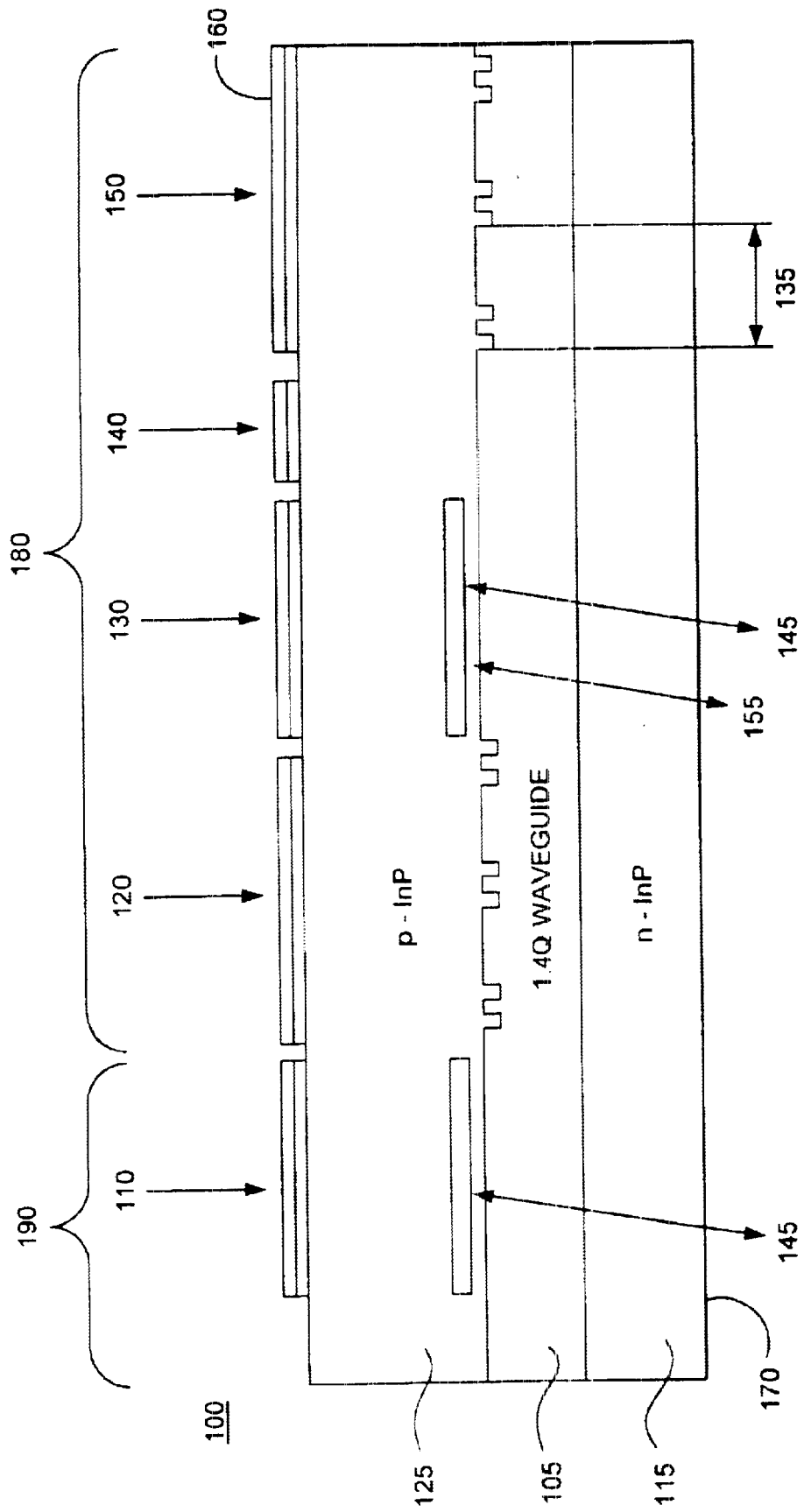
FIG. 1B is a cross-sectional view of one embodiment of a widely tunable laser assembly of the present invention and the integration of materials with differing optical properties by an offset quantum well technique.

FIG. 1B shows a longitudinal cross section of a laser assembly 100 of FIG. 1A. In FIG. 1B, laser assembly 100, waveguide 105, amplifier gain section 110, front resonator mirror 120, laser gain section 130, laser phase control section 140, back mirror 150 and electrical contact 160, epitaxial structure 170, laser 180, optical amplifier 190, output facet 195, p type semiconductor layer 125, n-type semiconductor layer 115, mirror sampling period 135, offset quantum wells 145 and stop etch layer 155 are shown.

In FIG. 1B waveguide 105 is formed between p-type and n-type semiconductor layers 125 and 115, respectively. Mirrors 120 and 150 are formed by sample gratings etched in waveguide 105 with sampling period 135, as is well-understood in the art.

FIG. 1B illustrates the structure resulting from an offset quantum well technique for optically active and passive section formation. According to the offset quantum well technique, the optically active sections have multiple quantum well layers 145 grown in a region offset from waveguide 105. The multiple quantum well layers are separated from the waveguide by a thin stop etch layer 155. Removal of quantum wells, by etching for example, forms optically passive sections.

Figure 2A:
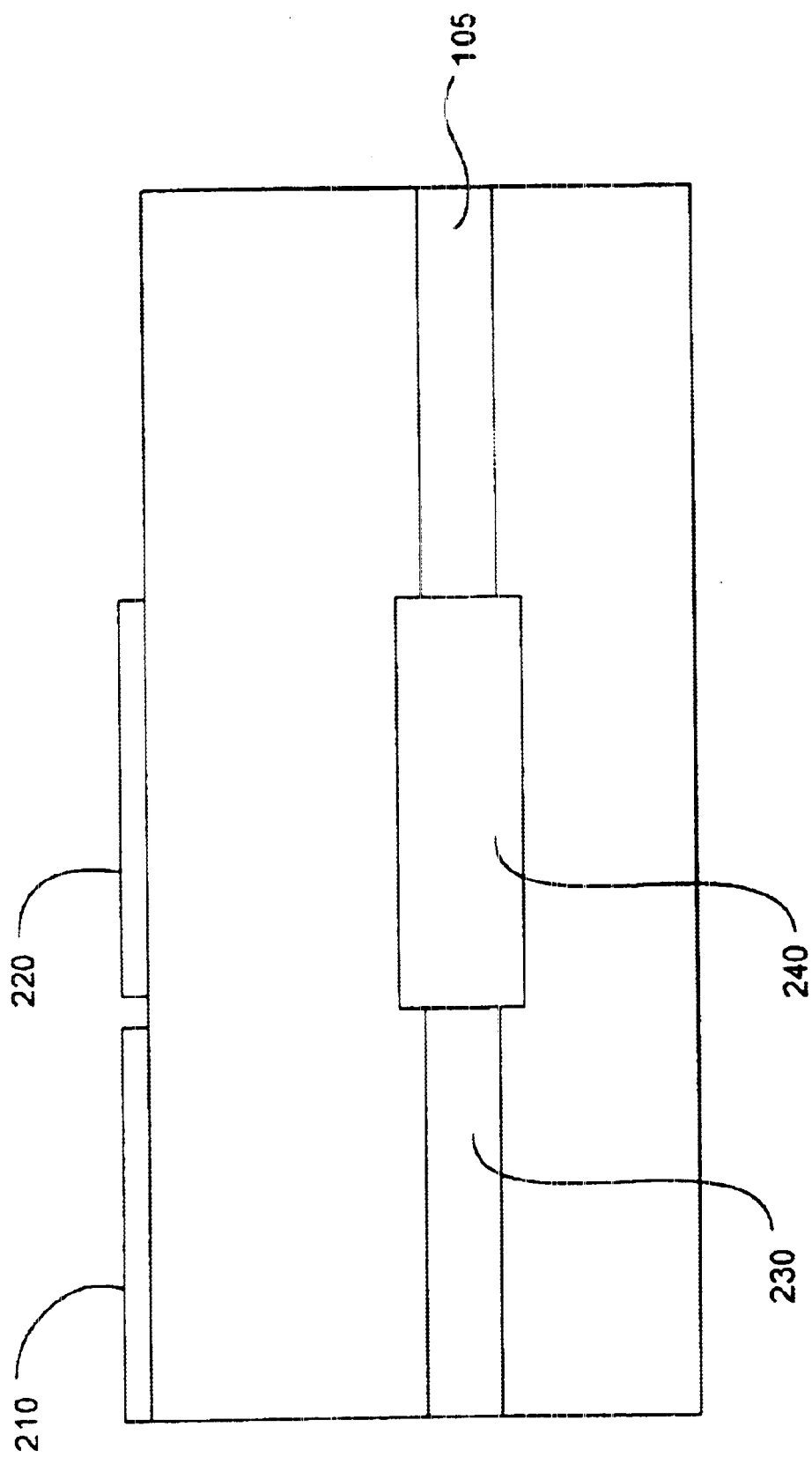
FIG. 2A is a cross-sectional view of one embodiment of an amplifier illustrating several layer structures and the integration of two materials with differing optical properties by a selected area growth technique.
Figure 2B:
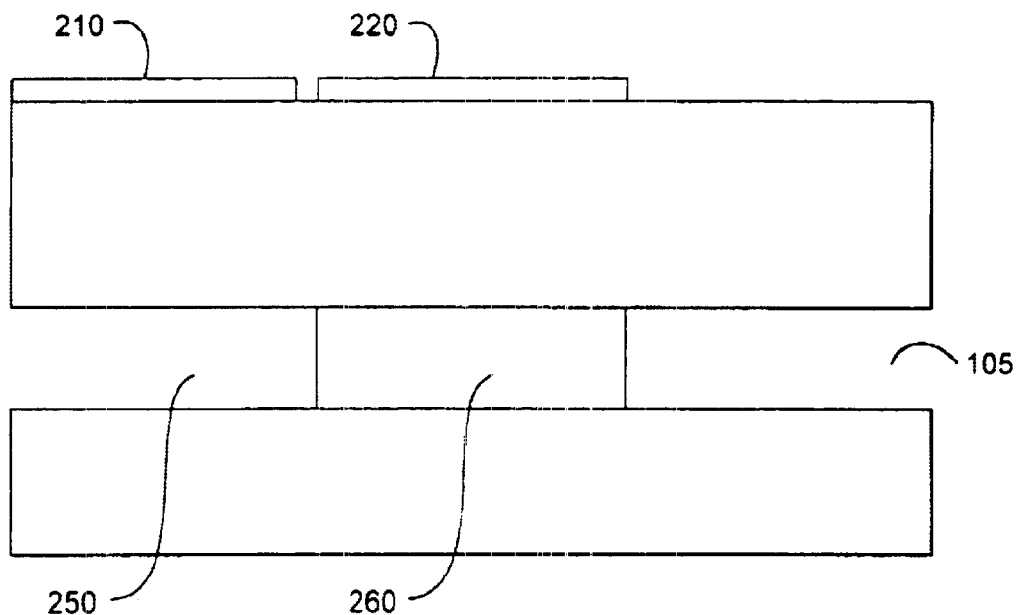
FIG. 2B is a cross-sectional view of the FIG. 2 assembly illustrating one embodiment for the integration of materials with differing optical properties by a disordered well technique.
Figure 2C:
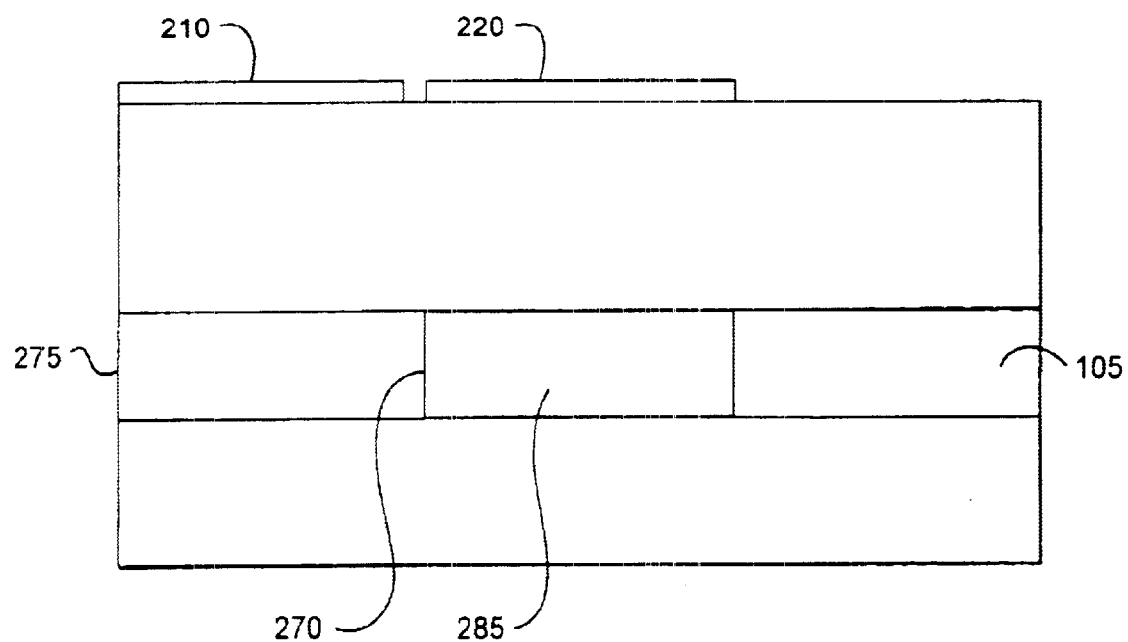
FIG. 2C is a cross-sectional view of one embodiment of an amplifier illustrating one embodiment for the integration of several different band gap materials by a butt joint regrowth technique.

FIGS. 2A–2C illustrate cross-sectional structures over a portion of laser assembly 100 (see FIG. 1) resulting from different techniques for forming optically active and passive sections and their junctions. FIG. 2A illustrates a cross-sectional structure over a portion of laser assembly 100 (see FIG. 1) resulting from a selected area regrowth technique. The selected area regrowth technique uses a dielectric mask to selectively control the growth rate and composition over different areas of the epitaxial structure. Thus, the material's bandgap can be shifted in certain sections making the material in that section passive or non-absorbing at desired wavelengths. In FIG. 2A, optically passive section 210, optically active section 220, bandgap-shifted quantum wells 230, active section quantum wells 240, and waveguide 105 (see FIGS. 1A–1B) are shown. In FIG. 2A, different portions of waveguide 105 are optically active or passive due to bandgap-shifting of the quantum wells within the waveguide.

FIG. 2B illustrates a cross-sectional structure over a portion of laser assembly 100 (see FIG. 1) resulting from a selected area disordering technique for forming optically active and passive sections. The selected area disordering technique uses a dielectric cap or ion implantation to introduce vacancies which can be diffused through an active region to disorder the quantum wells by intermixing them. This disordering shifts quantum well bandgaps, creating optically passive waveguide sections.

In FIG. 2B, optically passive section 210, optically active section 220, disordered wells 250, active section multiple quantum wells 260, and waveguide 105 (see FIGS. 1A–1B) are shown. In FIG. 2B, different portions of waveguide 105, sections 210 and 220, are optically active or passive due to the organization of the quantum wells within the waveguide material.

FIG. 2C illustrates a cross-sectional structure over a portion of laser assembly 100 (see FIG. 1) resulting from a butt joint regrowth technique for forming optically active and passive sections. According to the butt joint regrowth technique, the entire waveguide is etched away in optically passive sections and an optically passive waveguide is grown again. The newly grown portion of the waveguide is butted up against the active waveguide. In FIG. 2B, optically passive section 210, optically active section 220, active, butt-joint interface 270, passive waveguide section 275, active waveguide section 285 and waveguide 105 (see FIGS. 1A–1B) are shown. In FIG. 2B, active waveguide section 285 and passive waveguide section 275 are separated by a distinct large gradient butt-joint interface 270 as a result of the etch removal process.

FIGS. 3A–3D are plan views, illustrating different embodiments of optical amplifier 190 (see FIG. 1). In FIGS. 3A–3D optical amplifier 190, waveguide 105, epitaxial structure 170, output facet 195, active amplifier section 310, passive amplifier section 320, active-passive junction 330, curved waveguide portion 340, flared waveguide portions 350 and 355 and waveguide mode adapter 360 are shown.

Figure 3A:
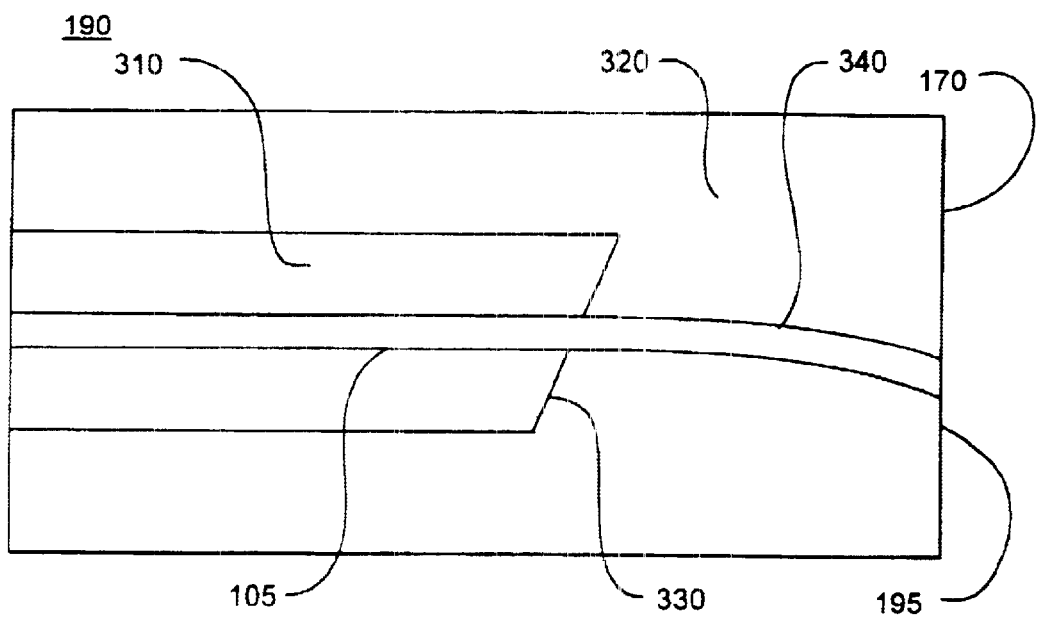
FIG. 3A is a cross-sectional view of one embodiment of the FIG. 1 optical amplifier element where a portion of the waveguide is curved and an interface between an active and a passive section is oblique.

In FIG. 3A. optical amplifier 190 has an active amplifier section 310 combined with a passive amplifier section 320, where the passive amplifier section includes curved waveguide portion 340. The curved waveguide portion intersects output facet 195 at an oblique angle. Both the waveguide curvature and oblique intersection significantly reduces the amount of light reflecting from the output facet back into the amplifier and laser. Active-passive junction 330 is preferably oblique to a centerline of wave guide 105 so that any reflections from this interface coupling back into the amplifier and laser will be reduced. However, alternate embodiments may have active-passive junction 330 substantially normal to a centerline of the waveguide.

Figure 3B:
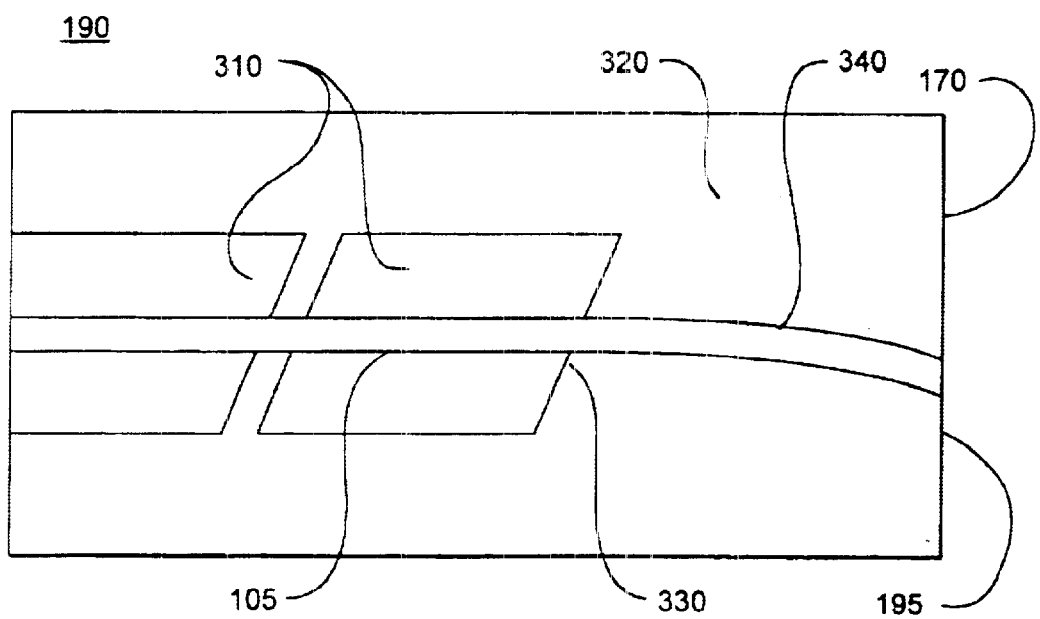
FIG. 3B is a cross-sectional view of one embodiment of the FIG. 1 optical amplifier element where the amplifier includes a plurality of gain sections.

FIG. 3B shows an alternate embodiment where the amplifier active section has been segmented into a plurality of active sections in order to increase the amplifier output power and reduce a noise figure. In this embodiment shown in FIG. 3B, the amplifier active section is segmented into two amplifier active sections 310 that may be independently controllable. Other embodiments have more than two amplifier active sections. This segmenting of the amplifier enables the use of different bias points for the different sections. Having a plurality of amplifier stages allows higher saturated output powers to be reached with better noise performance.

Figure 3C:
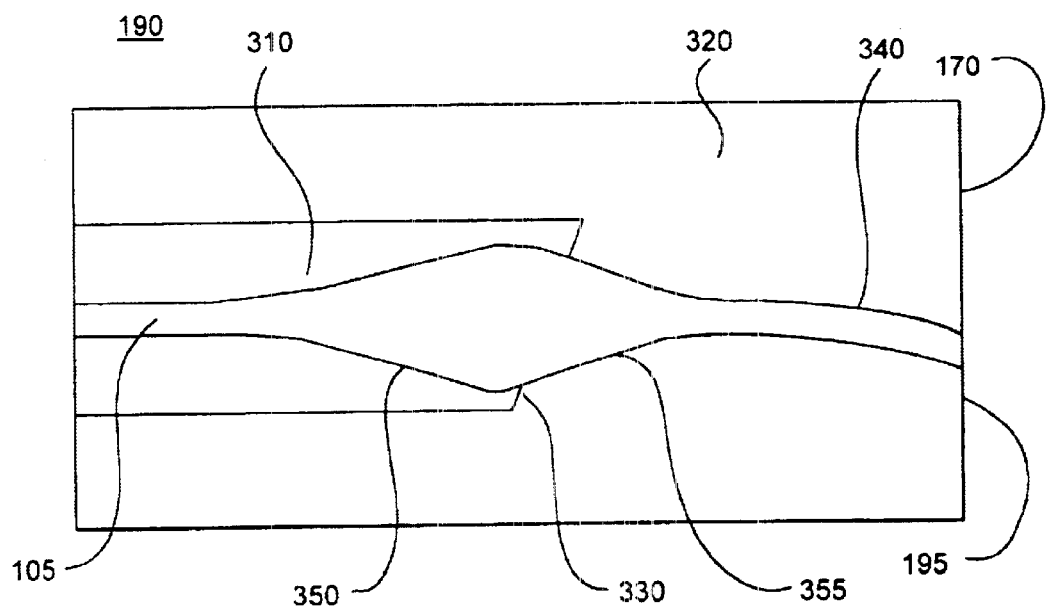
FIG. 3C is a cross-sectional view of one embodiment of the FIG. 1 optical amplifier element where the amplifier includes a flared waveguide.

FIG. 3C shows an alternate embodiment where a waveguide portion in the amplifier active section is flared, or tapered, to increase the saturated output power. Flared waveguide portion 350 increases the amplifier active volume as compared to the embodiment shown in FIG. 3A and decreases the photon density. To accomplish this effectively without introducing significant fiber coupling difficulties it is preferable to use an adiabatic flare, wherein there is no energy transfer across optical modes over the flare to a wider waveguide cross-section. In a preferred embodiment, a second flared-down section 355 to a narrow waveguide cross-section is positioned in the amplifier optically passive section 320 since it is difficult to couple effectively from a wide waveguide into a single mode fiber at output facet 195. In a preferred embodiment, such a flared-down portion is before a curved waveguide portion 340, otherwise, higher order modes will be excited when curving the wide waveguide. In the embodiment shown in FIG. 3C, active-passive junction 330 is angled so that any reflections from this interface coupling back into the amplifier and laser will be reduced.

Figure 3D:
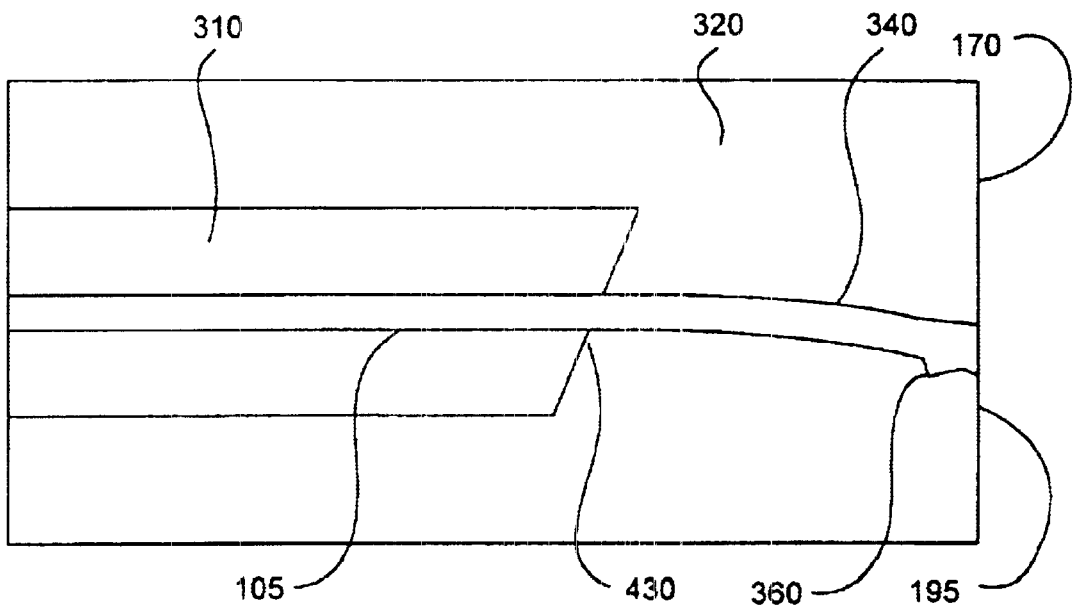
FIG. 3D is a cross-sectional view of one embodiment of the FIG. 1 optical amplifier element where the amplifier includes a waveguide mode adapter.

FIG. 3D shows another embodiment including a waveguide mode adapter. A waveguide mode adapter is preferred in many embodiments to enlarge the optical mode near output facet 195 so that it is more closely matched to the mode in an optical fiber that, as an element in a communications system, may carry the light away from the output facet. Including a waveguide mode adapter thus reduces the fiber coupling loss and increases the alignment tolerances between laser assembly 100 (see FIG. 1) and an optical fiber of another system. An embodiment of a waveguide mode adapter includes a section of passive waveguide wherein the waveguide's cross sectional is varied to expand the waveguide optical mode in an adiabatic manner.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A method of generating an optical signal, comprising:
providing a diode laser assembly including an epitaxial structure formed on a substrate, a laser and an amplifier formed in the epitaxial structure, the laser including first and second reflectors, a gain section and a phase section, the gain section and the phase section each being positioned between the first and second reflectors to produce a tunable laser output therefrom, at least a portion of the laser and an amplifier sharing a common waveguide formed in the epitaxial structure, wherein at least a portion of the common waveguide is curved to reduce reflections from an output facet;
coupling the laser output into the amplifier along the common waveguide; and
generating an optical signal from the amplifier in response to the coupled laser output.

2. The method of claim 1, wherein the optical signal is generated while controlling an intensity of the laser output and maintaining a constant laser wavelength.

3. The method of claim 1, wherein the curved portion of the common waveguide reduces an amount of light reflecting into the amplifier and laser.

4. The method of claim 1, further comprising a waveguide mode adapter to enlarge an optical mode near the output facet, so that it is more closely matched to a mode in an optical fiber.

5. The method of claim 1, wherein laser output is tunable over a tuning range while maintaining a substantially constant output power.

6. The method of claim 1, wherein laser output is tunable over a tuning range of at least 15 nm while maintaining a substantially constant output power.

7. The method of claim 1, wherein the optical signal is generated while alternating a propagation direction of the laser output within the amplifier.

8. The method of claim 1, wherein the optical signal is generated while minimizing back reflections into the laser.

9. The method of claim 1, wherein the optical signal is generated while alternating at least one optical mode in the amplifier.

10. The method of claim 9, wherein altering the optical modes is an adiabatic mode expansion.

11. The method of claim 1, wherein the optical signal is generated while selectively exciting waveguide modes in the amplifier.

12. The method of claim 1, wherein the curved portion of the common waveguide intersects the output facet at an oblique angle.

13. The method of claim 12, wherein both the curved portion of the common waveguide and the oblique angle reduce an amount of light reflecting from the output facet back into the amplifier and laser.

14. A method of generating an optical signal, comprising:
providing a diode laser assembly including first and second semiconductor layers in an epitaxial structure, a waveguide formed between the first and second semiconductor layers in the epitaxial structure, and a laser and an amplifier formed in the epitaxial structure, the laser including a gain section and a phase section each being positioned between two grating sections to produce a tunable laser output therefrom, wherein at least a portion of the waveguide is curved to reduce reflections from an output facet;

coupling the laser output into the amplifier along the waveguide;

propagating the laser output in a tapered section of the waveguide in the amplifier to increase saturated output power; and generating an optical signal from the amplifier in response to the propagated laser output.

15. The method of claim 14, wherein the optical signal is generated while controlling an intensity of the laser output and maintaining a constant laser wavelength.

16. The method of claim 14, wherein the laser output is tunable over a tuning range while maintaining a substantially constant output power.

17. the method of claim 14, wherein the laser output is tunable over a tuning range of at least 15 nm while maintaining a substantially constant output power.

18. The method of claim 14, wherein the optical signal is generated while alternating a propagation direction of the laser output within the amplifier.

19. The method of claim 14, wherein the optical signal is generated while minimizing back reflections into the laser.

20. The method of claim 14, wherein the optical signal is generated while altering at least one optical mode in the amplifier.

21. The method of claim 20, wherein altering the optical modes is an adiabatic mode expansion.

22. The method of claim 14, wherein the optical signal is generated while selectively exciting waveguide modes in the amplifier.

23. The method of claim 14, wherein the curved portion of the waveguide reduces an amount of light reflecting into the amplifier and laser.

24. The method of claim 14, wherein the curved portion of the waveguide intersects the output facet at an oblique angle.

25. The method of claim 24, wherein both the curved portion of the waveguide and the oblique angle reduce an amount of light reflecting from the output facet back into the amplifier and laser.

26. The method of claim 14, further comprising a waveguide mode adapter to enlarge an optical mode near the output facet, so that it is more closely matched to a mode in an optical fiber.

* * * * *

(12) INTER PARTES REEXAMINATION CERTIFICATE (0444th)
United States Patent
Mason et al.

(10) Number: US 6,687,278 C1
(45) Certificate Issued: Sep. 4, 2012

(54) METHOD OF GENERATING AN OPTICAL SIGNAL WITH A TUNABLE LASER SOURCE WITH INTEGRATED OPTICAL AMPLIFIER

(75) Inventors: Thomas Beck Mason, Middletown, NJ (US); Gregory Fish, Santa Barbara, CA (US); Larry Coldren, Santa Barbara, CA (US)

(73) Assignee: JDS Uniphase Corporation, Milpitas, CA (US)

Reexamination Request:
No. 95/000,405, Oct. 16, 2008

Reexamination Certificate for:
Patent No.: 6,687,278
Issued: Feb. 3, 2004
Appl. No.: 09/614,665
Filed: Jul. 12, 2000

Related U.S. Application Data

(63) Continuation-in-part of application No. 09/614,895, filed on Jul. 12, 2000, now Pat. No. 6,349,106, and a continuation-in-part of application No. 09/614,674, filed on Jul. 12, 2000, now Pat. No. 6,624,000, and a continuation-in-part of application No. 09/614,378, filed on Jul. 12, 2000, now Pat. No. 6,628,690, and a continuation-in-part of application No. 09/614,377, filed on Jul. 12, 2000, now Pat. No. 6,580,739, and a continuation-in-part of application No. 09/614,376, filed on Jul. 12, 2000, now Pat. No. 6,614,819, and a continuation-in-part of application No. 09/614,375, filed on Jul. 12, 2000, now Pat. No. 6,658,035, and a continuation-in-part of application No. 09/614,224, filed on Jul. 12, 2000, now Pat. No. 6,654,400, and a continuation-in-part of application No. 09/614,195, filed on Jul. 12, 2000, now Pat. No. 6,574,259.

(60) Provisional application No. 60/152,072, filed on Sep. 2, 1999, provisional application No. 60/152,049, filed on Sep. 2, 1999, and provisional application No. 60/152,038, filed on Sep. 2, 1999.

(51) Int. Cl.
*H01S 5/026* (2006.01)

(52) U.S. Cl. ............................. 372/50; 372/20; 372/22
(58) Field of Classification Search .................... None
See application file for complete search history.

(56) References Cited

To view the complete listing of prior art documents cited during the proceeding for Reexamination Control Number 95/000,405, please refer to the USPTO's public Patent Application Information Retrieval (PAIR) system under the Display References tab.

*Primary Examiner* — Tuan H Nguyen

(57) ABSTRACT

A method of generating an optical signal provides a diode laser assembly including an epitaxial structure formed on a substrate. A laser and an amplifier are formed in the epitaxial structure. At least a portion of the laser and amplifier share a common waveguide. A tunable laser output is produced from the laser. The laser output is coupled into the amplifier along the common waveguide. An optical signal is generated from the amplifier.

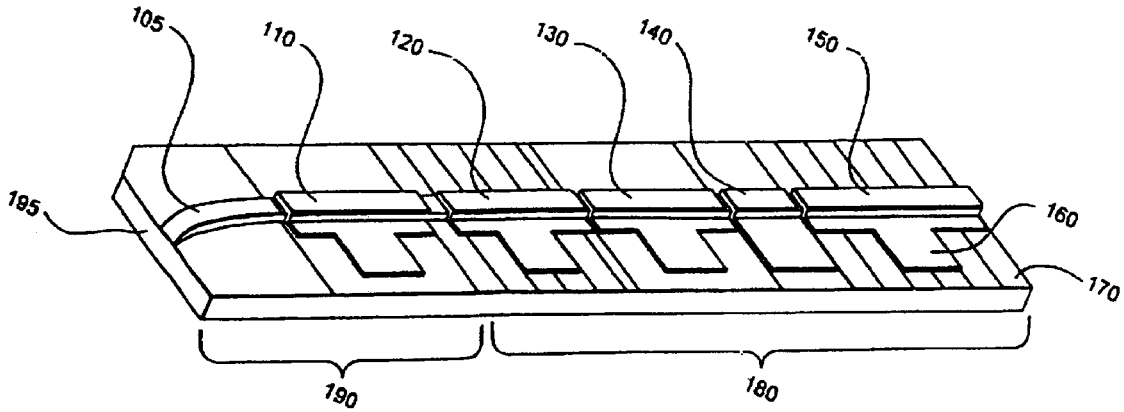

INTER PARTES REEXAMINATION CERTIFICATE ISSUED UNDER 35 U.S.C. 316

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-26 are cancelled.

New claims 27-58 are added and determined to be patentable.

27. *A method of generating an optical signal, comprising:*
    *providing a widely tunable diode laser assembly including an epitaxial structure formed on a substrate, a widely tunable laser and an amplifier formed in the epitaxial structure, the laser including first and second reflectors, a gain section and a phase section, the gain section and the phase section each being positioned between the first and second reflectors to produce a widely tunable laser output therefrom, at least a portion of the laser and an amplifier sharing a common waveguide formed in the epitaxial structure, wherein at least a portion of an output end of the common waveguide is curved to reduce reflections from an output facet;*
    *coupling the tunable laser output into the amplifier along the common waveguide and causing the amplifier to generate an increased output power optical signal in response to the coupled tunable laser output; and*
    *generating an optical signal from the amplifier in response to the coupled laser output while control of the increased output power optical signal generated by the amplifier is independent of frequency control in the tunable laser so the increased output power optical signal produced by the amplifier compensates for output power changes in the tunable laser due to losses in the reflectors during tuning the tunable laser.*

28. *The method of claim 27 wherein providing the widely tunable diode laser assembly includes providing an assembly having portions of the common waveguide proximal to the curved portion of the output end oriented along a crystal plane of the substrate perpendicular to the output facet.*

29. *The method of claim 28 wherein providing the widely tunable diode laser assembly includes providing an assembly wherein the common waveguide is a single waveguide extending from the laser through the amplifier and curved output end portion.*

30. *The method of claim 29 wherein providing the widely tunable diode laser assembly includes providing an assembly having the laser tunable to at least 50 wavelength channels within a wavelength range of a telecommunication system wavelength band.*

31. *The method of claim 30 wherein providing the widely tunable diode laser assembly includes providing an assembly having the curved output end portion of the waveguide in the amplifier.*

32. *The method of claim 31 wherein providing the widely tunable diode laser assembly includes providing an assembly having first and second reflectors that are independently controllable and controlling the first and second reflectors to tune the laser.*

33. *The method of claim 32 wherein providing the widely tunable diode laser assembly includes providing an assembly having the curved output end portion of the waveguide with a non-uniform curvature.*

34. *The method of claim 32 wherein providing the widely tunable diode laser assembly includes providing an assembly having the output end of the waveguide extending at an oblique angle with respect to the output facet.*

35. *The method of claim 34 wherein providing the widely tunable diode laser assembly includes providing an assembly having the waveguide with a flared portion between the laser and the output facet.*

36. *The method of claim 35 wherein providing the widely tunable diode laser assembly includes providing an assembly having the output end of the waveguide that intersects the output facet.*

37. *The method of claim 30 wherein providing the widely tunable diode laser assembly includes providing an assembly having the curved output end portion of the waveguide in a passive section.*

38. *The method of claim 37 wherein providing the widely tunable diode laser assembly includes providing an assembly having the curved output end portion of the waveguide with a non-uniform curvature.*

39. *The method of claim 37 wherein providing the widely tunable diode laser assembly includes providing an assembly having the output end of the waveguide extending at an oblique angle with respect to the output facet.*

40. *The method of claim 39 wherein providing the widely tunable diode laser assembly includes providing an assembly having the waveguide with a flared portion between the laser and the output facet.*

41. *The method of claim 40 wherein providing the widely tunable diode laser assembly includes providing an assembly having first and second reflectors that are independently controllable and independently controlling the first and second reflectors to tune the laser.*

42. *The method of claim 28 wherein providing the widely tunable diode laser assembly includes providing an assembly having at least portions of the waveguide in the amplifier oriented along a crystal plane of the substrate perpendicular to the output facet.*

43. *The method of claim 27 wherein providing the amplifier includes providing a continuous power booster amplifier that generates a continuously increased output power optical signal in response to the coupled tunable laser output.*

44. *A method of generating an optical signal, comprising:*
    *providing a widely tunable diode laser assembly including an epitaxial structure formed on a substrate, a widely tunable laser and a continuous power booster amplifier formed in the epitaxial structure, the laser tunable to at least 50 wavelength channels within a wavelength range in a telecommunication system wavelength band and including first and second reflectors, a gain section and a phase section, the gain section and the phase section each being positioned between the first and second reflectors to produce a tunable laser output therefrom, at least a portion of the laser and an amplifier sharing a common waveguide formed in the epitaxial structure, wherein at least a portion of the common waveguide is curved to reduce reflections from an output facet;*
    *coupling the laser output into the amplifier along the common waveguide; and* generating a continuously increased output power optical signal from the amplifier in response to the coupled tunable laser output.

45. The method of claim 44 wherein providing the widely tunable diode laser assembly includes providing an assembly having the curved portion of the waveguide at an output end of the waveguide.

46. The method of claim 45 wherein providing the widely tunable diode laser assembly includes providing an assembly having portions of the common waveguide proximal to the curved portion of the output end oriented along a crystal plane of the substrate perpendicular to the output facet.

47. The method of claim 46 wherein providing the widely tunable diode laser assembly includes providing an assembly wherein the common waveguide is a single waveguide extending from the laser through the amplifier and curved output end portion.

48. The method of claim 47 wherein providing the widely tunable diode laser assembly includes providing an assembly having first and second reflectors that are independently controllable and independently controlling the first and second reflectors to tune the laser.

49. The method of claim 48 and further including controlling the increased output power optical signal generated by the amplifier independently of frequency control in the tunable laser so the increased output power optical signal produced by the amplifier compensates for output power changes in the tunable laser due to losses in the reflectors during tuning of the tunable laser.

50. A method of generating an optical signal, comprising:
providing a widely tunable diode laser assembly including an epitaxial structure formed on a substrate, a widely laser and a continuous power booster amplifier formed in the expitaxial structure, the laser including first and second reflectors that are independently controllable, a gain section and a phase section, the gain section and the phase section each being positioned between the first and second reflectors to produce a tunable laser output therefrom, at least a portion of the laser and an amplifier sharing a common waveguide formed in the epitaxial structure, wherein at least a portion of the common waveguide is curved to reduce reflections from an output facet;
coupling the tunable laser output into the amplifier along the common waveguide; and
generating a continuously increased output power optical signal from the amplifier in response to the coupled tunable laser output; and
independently controlling the first and second reflectors to tune the laser.

51. The method of claim 50 wherein providing the widely tunable diode laser assembly includes providing an assembly having the curved portion of the waveguide at an output end portion of the waveguide.

52. The method of claim 51 wherein providing the widely tunable diode laser assembly includes providing an assembly having portions of the common waveguide proximal to the curved portion of the output end oriented along a crystal plane of the substrate perpendicular to the output facet.

53. The method of claim 52 wherein providing the widely tunable diode laser assembly includes providing an assembly wherein the common waveguide is a single waveguide extending from the laser through the amplifier and curved output end portion.

54. The method of claim 53 and further including controlling the increased output power optical signal generated by the amplifier independently of frequency control in the tunable laser so the increased output power optical signal produced by the amplifier compensates for output power changes in the tunable laser due to losses in the reflectors during tuning of the tunable laser.

55. The method of claim 54 wherein providing the widely tunable diode laser assembly includes providing an assembly having the laser tunable to at least 50 wavelength channels within a wavelength range of a telecommunication system wavelength band.

56. The method of claim 55 wherein providing the widely tunable diode laser assembly includes providing an assembly having the curved output end portion of the waveguide in the amplifier.

57. The method of claim 56 wherein providing the widely tunable diode laser assembly includes providing an assembly having the waveguide with an output end that intersects the output facet at an oblique angle.

58. The method of claim 57 wherein providing the widely tunable diode laser assembly includes providing an assembly having at least a portion of the waveguide in the amplifier flared to increase saturated output power.

* * * * *